United States Patent [19]

Nojiri et al.

[11] Patent Number: 4,706,254
[45] Date of Patent: Nov. 10, 1987

[54] SEMICONDUCTOR DEVICE AND ITS FABRICATION

[75] Inventors: Hidetoshi Nojiri, Matsudo; Seiichi Miyazawa, Yokohama; Isao Hakamada, Yokohama; Yoshioki Hajimoto, Yokohama, all of Japan

[73] Assignee: Canon Kabushiki Kaisha, Tokyo, Japan

[21] Appl. No.: 608,510

[22] Filed: May 9, 1984

[30] Foreign Application Priority Data

May 12, 1983 [JP] Japan .................................. 58-83919
May 25, 1983 [JP] Japan .................................. 58-92989

[51] Int. Cl.$^4$ ................................................ H01S 3/19
[52] U.S. Cl. ........................................ 372/46; 357/17; 357/59
[58] Field of Search ............... 372/45, 46, 48; 357/17, 357/59

[56] References Cited

U.S. PATENT DOCUMENTS 4,230,997 10/1980 Hartman et al. ..................... 372/46
4,464,762 8/1984 Furuya .................................. 372/50
4,523,961 6/1985 Hartman et al. .................... 372/46

FOREIGN PATENT DOCUMENTS 1542438 3/1979 United Kingdom .................. 372/46

OTHER PUBLICATIONS

Chen et al, "Narrow Double-Current-Confinement Channeled-Substrate Planar Laser Fabricated by Double Etching Technique", Appl. Phys Lett 36(8), Apr. 15, 1980, pp. 634-636.

Primary Examiner—James W. Davie
Attorney, Agent, or Firm—Fitzpatrick, Cella, Harper & Scinto

[57] ABSTRACT

A semiconductor device is constructed with a monocrystalline semiconductor layer laminated in a strip-pattern on a substrate, and amorphous or polycrystalline semiconductor layer formed on the substrate in a manner to encompass the monocrystalline semiconductor layers. The monocrystalline semiconductor layer comprises a plurality of layers including a laser active layer.

2 Claims, 10 Drawing Figures

SEMICONDUCTOR DEVICE AND ITS FABRICATION

BACKGROUND OF THE INVENTION

1. Field of the Invention

This invention relates to a semiconductor device which necessitates current stricture, and a method for its fabrication.

2. Description of Prior Art

A semiconductor laser is representative of a semiconductor device which requires current stricture or restriction. Owing to its high monochromaticity, directivity, etc., much is expected of the semiconductor laser in its applications to optical communication, optical memory, and others. Such semiconductor lasers have been able to lower a threshold value current density by limiting a current flowing region with such a construction as shown in FIG. 1 of the accompanying drawing, and to oscillate in a single mode.

More specifically, in FIG. 1, a reference numeral 1 designates an n-type GaAs substrate, a numeral 2 refers to an n-type GaAlAs layer, 3 denotes a GaAs active layer, 4 a p-type GaAlAs layer, 5 a p-type GaAs layer, 6 a positive electrode, 7 a negative electrode, 8 refers to protons, and 9 represents a high resistance region. This semiconductor laser is formed by laminating the semiconductor layers 2, 3, 4 and 5 on the substrate 1, and then irradiating protons 8 onto the laminated layers with the positive electrode 6 in a stripe pattern using masking, thereby providing on top of the laminated layers the high resistance region 9. In such a construction, electric current flowing across the two electrodes is restricted by the high resistance region 9, and is concentrated on the stripe-patterned region, on account of which there can be obtained luminescence having low current density and good monochromaticity.

In the above-described fabrication of the semiconductor device, protons are irradiated from the topmost surface of the laminated semiconductor layers, on account of which the region to be restricted becomes broader as it goes down in the depthwise direction, as shown in FIG. 1, with the consequent disadvantage such that the current restricted effect of the resulting semiconductor laser is not enough.

FIG. 2 illustrates another structural example of the conventional semiconductor laser. In FIG. 2, 11 designates an n-type $Ga_{1-x}Al_xAs$ layer ($0 < x \leq 1$), 12 refers to a GaAs active layer, 13 denotes a p-type $Ga_{1-x'}Al_{x'}As$ layer ($0 < x' \leq 1$), 14 a $p^+$-type GaAs layer, 15 an $n^+$-type GaAs substrate, 16 and 17 denote electrodes, and 18 a buried layer. In this construction of the semiconductor laser, the buried layer 18 has a smaller refractive index, and a higher resistance, than the GaAs active layer 12, so that it functions as the current restricting layer, and, at the same time, it confines light within the GaAs active layer 12, thereby causing the semiconductor laser to oscillate with good efficiency and with a low current density.

However, even in such a construction as illustrated in FIG. 2, since the buried layer 8 is made of a material having a composition closer to that of the active layer or each of the laminated layers, values of the refractive index and the resistance to be obtained are limited, so that the current restriction and the light confinement are not satisfactory. In addition, since the buried layer 8 was formed by use of an n-type $Ga_{1-y}Al_yAs$ ($y > x$, $y > x'$) or a high resistance type GaAs, which is re-grown by the liquid-phase epitaxial method, the conditions for the re-growth were very stringent and the fabrication of the semiconductor laser was disadvantageously difficult.

SUMMARY OF THE INVENTION

It is therefore an object of the present invention to provide a semiconductor device excellent in its current restriction effect.

It is another object of the present invention to provide a method for easily fabricating the semiconductor device excellent in its current restriction effect.

According to the present invention, in one aspect of it, there is provided a semiconductor device, comprising: a substrate; a plurality of monocrystalline semiconductor layers laminated in a stripe pattern on said substrate, and including a laser active layer; and an amorphous or polycrystalline semiconductor layer formed on said substrate in a manner to encompass said crystalline semiconductor layer.

In another aspect of the present invention, there is provided a method for fabricating a semiconductor device, comprising: a first step of forming a plurality of semiconductor layers, inclusive of a laser active layer, one after the other on a substrate by crystal growth; a second step of forming a particular region in a mesa-stripe construction by etching said plurality of semiconductor layers laminated on said substrate; and a third step of forming an amorphous semiconductor layer on said substrate in a manner to bury said particular region.

The foregoing and other objects as well as the specific construction and method of fabrication of the semiconductor device according to the present invention will become more apparent and understandable from the following detailed description of preferred embodiments thereof, when read in conjunction with the accompanying drawing.

DETAILED DESCRIPTION OF PREFERRED EMBODIMENTS

Figure 1:
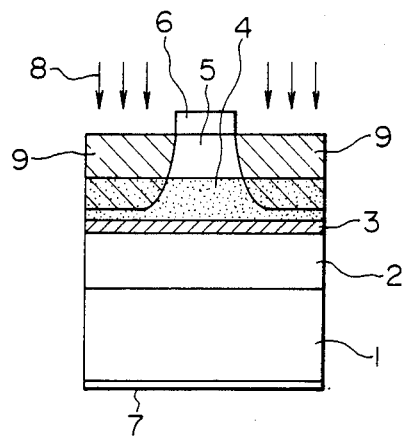
FIG. 1 is a schematic cross-sectional view showing an exemplary construction of a conventional semiconductor laser.

In the following, the present invention will be described in detail in reference to a couple of preferred embodiments thereof as illustrated in the drawing.

Figure 3:
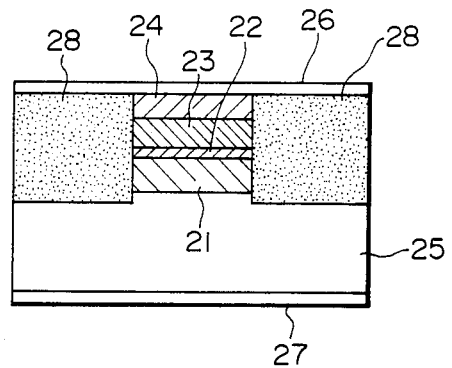
FIG. 3 is a schematic cross-sectional view showing a construction of a semiconductor laser as the first embodiment of the semiconductor device according to the present invention.

Referring to FIG. 3 showing a schematic cross-sectional view of a semiconductor laser as the first embodiment of the semiconductor according to the present invention, a reference numeral 21 designates an n-type $Ga_{1-x}Al_xAs$ layer ($0<x\leqq1$), 22 refers to a GaAs active layer, 23 a p-type $Ga_{1-x'}Al_{x'}As$ layer ($0<x'\leqq1$), 24 a p+-type GaAs layer, 25 an n+-GaAs substrate, 26 and 27 designate electrodes, and 28 refers to an amorphous silicon layer. In this embodiment, the semiconductor device is fabricated such that a plurality of the semiconductor layers 21 to 25 in a mesa-stripe construction, including the active layer 22, are buried in the amorphous silicon layer 28. In this construction of the semiconductor device, the amorphous silicon layer has a lower refractive index and a higher resistance than those of each of the semiconductor layers forming the mesa stripe construction. On account of this, electric current flowing in this semiconductor device and tending to spread within it is restricted by the amorphous silicon layer 28, and flows mostly in the semiconductor layers of the mesa-stripe construction. Also, oscillated light is confined in the active layer 22 owing to a difference in refractive index between the active layer 22 and the amorphous silicon layer 28. Thus, the semiconductor device according to this embodiment efficiently confines light and electric current in the breadthwise direction of a resonator by means of the amorphous silicon, thereby making it possible to oscillate light with a current density much lower than that of the conventional buried type semiconductor device.

In the following, explanations will be given, with reference to FIG. 4, as to the fabrication steps of the semiconductor device according to the above-described embodiment. It should be noted that those parts in FIG. 4 which are identical with, or equivalent to, those in FIG. 3 are designated by the same reference numerals, and detailed explanations for them are dispensed with.

Figure 2:
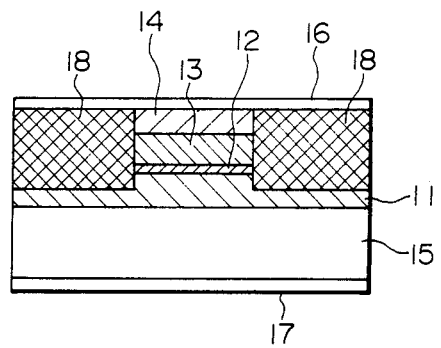
FIG. 2 is a schematic cross-sectional view showing another exemplary construction of a conventional semiconductor laser.
Figure 4A:
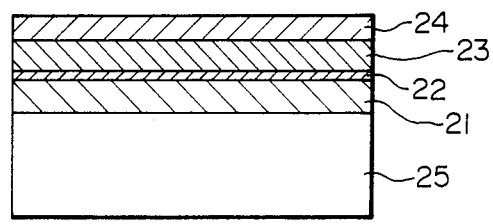
FIGS. 4A, 4B and 4C are schematic cross-sectional views for explaining the method of fabricating the first embodiment of the semiconductor laser shown in FIG. 3.
Figure 4B:
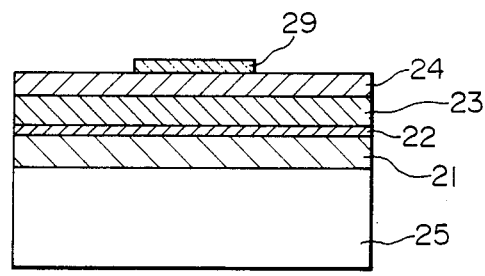
Figure 4C:
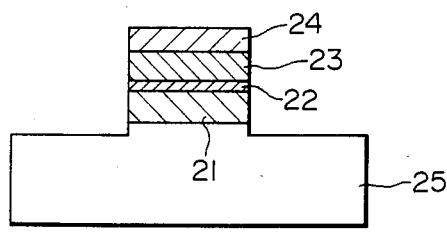

Referring first to FIG. 4A, each of the semiconductor layers 21 to 24, including the active layer 22, are epitaxially grown on the n+-type GaAs substrate 25. This crystal growth may be carried out by any known method such as the liquid-phase epitaxial method (LPE), the gas-phase epitaxial method (CVD), and the molecular beam epitaxial method (MBE). Next, an SiO$_2$ film is vapor-deposited on the topmost semiconductor layer 24, and then the SiO$_2$ film covering those portions where the semiconductor layers are to be etched is removed by the photo-lithographic process, thereby forming a mask 29. After this, the etching is done by known etching methods such as reactive ion etching, dry etching, wet etching, and so forth, and finally the mask 29 is removed to form the particular region composed of the semiconductor layers in the mesa-stripe construction as shown in FIG. 4C. Further, amorphous silicon is grown on the substrate 25, thereby forming a buried type semiconductor device as shown in FIG. 2. For the growth of amorphous silicon, there may be employed an ordinary sputtering method and a glow-discharging (GD) method. With these methods, it is possible to fabricate the semiconductor device more easily than conventional devices, wherein the buried layer is formed by re-growth of GaAlAs, etc.

The above mentioned amorphous silicon has its characteristic such that values of its refractive index and resistance are varied depending on difference in an intake quantity of hydrogen existing in the atmosphere for the crystal growth. For example, in case of the hydrogen content being 7 to 8%, the amorphous silicon having its refractive index and resistance value closer to those of crystalline silicon (refractive index n=3.3–3.4; low resistance) can be obtained at a growth temperature of 300° C. or so. Conversely, if the hydrogen content is 30% or so, the amorphous silicon having a refractive index of n=2.6 and high resistance will grow at a room temperature. Accordingly, by controlling the hydrogen content at the time of the crystal growth, there can be obtained amorphous silicon having a desired characteristic. When it is used in the above-described embodiment, the amorphous silicon should desirably be of low refractive index and high resistance. Further, in the above-described embodiment, amorphous germanium may be substituted for amorphous silicon to form the buried layer for the same effect. Furthermore, the material for the semiconductor layer of the mesa-stripe construction is not limited to GaAs/GaAlAs type, but any other kinds of semiconductive material may be used.

Figure 5A:
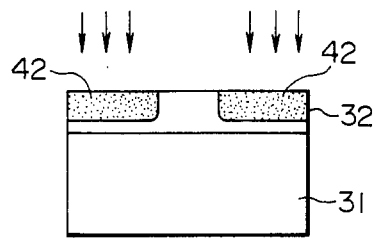
FIGS. 5A, 5B and 5C are schematic cross-sectional views showing a construction and fabrication steps of a semiconductor laser as the second embodiment of the semiconductor device according to the present invention.
Figure 5B:
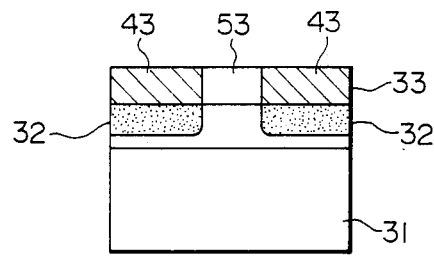
Figure 5C:
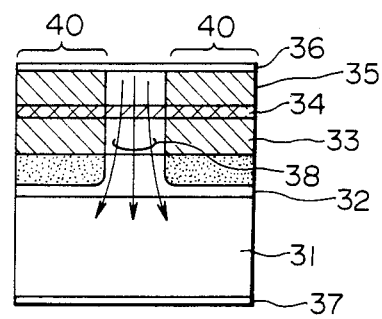

FIGS. 5A to 5C are schematic cross-sectional views for explaining the semiconductor laser as the second embodiment of the semiconductor device according to the present invention, and its fabrication steps. Referring first to FIG. 5A, a GaAs layer 32 free from impurities is formed by the single crystal growth on a monocrystalline GaAs substrate 31. Following this, gallium or arsenic is injected at high density into the GaAs layer 32 by the ion-implantation technique so as to vary a part of the crystallographic structure in the GaAs layer 32 and to form a high resistance layer 42, leaving the monocrystalline portion in the stripe pattern.

Next, as shown in FIG. 5B, an InGaP layer 33 is caused to grow over the GaAs layer 32 inclusive of the high resistance layer 42. In this case, a portion 53 which has grown in the InGaP layer 33 and over the monocrystalline portion of the GaAs layer 32 is turned into a single crystal, while a portion 43 which has grown over the high resistance layer 42 is rendered amorphous or polycrystalline.

Following this, as shown in FIG. 5C, a GaAs active layer 34 and an InGaP layer 35 are laminated over the InGaP layer 33, after which the electrodes 36 and 37 are attached on the laminated body, thereby forming the semiconductor laser. The thus fabricated semiconductor laser has high resistance regions 40, formed by the high resistance GaAs layer 32 and the amorphous or polycrystalline portion in each of the semiconductor layers which have grown on the GaAs layer. Since the stripe-patterned region to be constricted by the high resistance regions 40 extend to a location closer to the substrate, a passageway for electric current 38 flowing across the electrodes is restricted by this narrow region, whereby oscillation can be done at a low current density. Also, since the refractive index of the stripe-patterned region in the GaAs active layer 34 is greater than that of the high resistance regions defined by the amorphous or polycrystalline portions of the semiconductor layers, the light oscillation from the semiconductor laser is confined in this stripe-patterned region, thereby enabling the semiconductor laser to oscillate with good efficiency.

Figure 6:
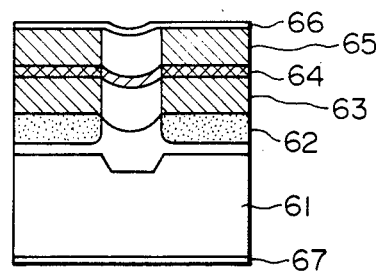
FIG. 6 is a schematic cross-sectional view showing a construction of the semiconductor laser as the third embodiment of the semiconductor device according to the present invention.

FIG. 6 is a schematic cross-sectional view of the semiconductor laser as the third embodiment of the present invention, which is formed in the exactly same method as the embodiment in FIG. 2. In the illustrated construction, a reference numeral 61 designates a GaAs substrate with a groove having been formed beforehand in a stripe pattern; a numeral 62 refers to a GaAs layer; 63 and 65 represent InGaP layer; 64 a GaAs active layer; and 66 and 67 electrodes. This third embodiment also forms the high resistance region in the same manner as in the second embodiment, so that the current flow across the electrodes 66, 67 is restricted by the stripe-patterned region.

Owing to the groove formed in the GaAs substrate 61 in this third embodiment, each of the semiconductor layers laminated on the substrate has a step-wedge in the stripe-patterned region and the high resistance region, taking after the groove formed in the substrate. As a consequence of this, the stripe-patterned light-emitting region in the GaAs active region 64 is enclosed by the InGaP layer in all directions, whereby the light confining effect is enhanced. In addition, the current constriction effect improves much more to thereby make it possible to obtain the laser oscillation with much better efficiency than in the second embodiment.

In the above-described second and third embodiments of the present invention, the semiconductor layers can be formed by any of the known crystal growing methods. In particular, however, use of the molecular beam epitaxy (MBE) is desirable, because the method is capable of forming both a high resistance layer and semiconductor layers continuously in one and the same fabricating device. While the high resistance layer is formed on the semiconductor layers grown on the substrate, it is also possible that such high resistance layer be directly formed on the substrate by changing the crystallographic structure of a part of the substrate in the same manner as in the first embodiment. Furthermore, in these embodiments, the semiconductor layer is rendered to be of high resistance by injection of gallium or arsenic, although use of accelerated particles such as proton, hydrogen ion, oxygen, etc. is feasible for the purpose.

The material for the semiconductor layers in the second and third embodiments may be selected from GaAlAs, InGaAsP, InGaAs, ZnSe, and so on, besides GaAs/InGaP. Moreover, the fabrication method as has already been explained in reference to FIG. 2 is applicable not only to the semiconductor laser, but also to separation of elements in other semiconductor devices.

Although the present invention has been described specifically in reference to preferred embodiments thereof, it should be understood that changes and modifications may be made by those persons skilled in the art within the spirit and scope of the invention as recited in the appended claims.

What we claim is:

1. A semiconductor device, comprising:
   (a) substrate;
   (b) a plurality of monocrystalline semiconductor layers including a laser active layer, said semiconductor layers constituting a resonator in a mesa-stripe construction formed on said substrate; and
   (c) an amorphous semiconductor layer formed on said substrate in a manner to bury said monocrystalline semiconductor layers with respect to a breadthwise direction of the resonator so as to confine light in the active layer, said amorphous semiconductor layer being made of one of amorphous silicon and amorphous germanium.

2. The semiconductor device according to claim 1, wherein said monocrystalline semiconductor layers are formed by lamination of a GaAs layer and a GaAlAs layer.

* * * * *

UNITED STATES PATENT AND TRADEMARK OFFICE
CERTIFICATE OF CORRECTION

PATENT NO. : 4,706,254
DATED : November 10, 1987
INVENTOR(S) : HIDETOSHI NOJIRI, ET AL.

It is certified that error appears in the above-identified patent and that said Letters Patent is hereby corrected as shown below:

AT [57] IN THE ABSTRACT:

Line 2, "strip-pat-" should read --stripe-pat---.

COLUMN 1

Line 44, "restricted" should read --restriction--.

COLUMN 3

Line 23, "mesa stripe" should read --mesa-stripe--.

COLUMN 4

Line 1, "above mentioned" should read
      --above-mentioned--.
  Line 55, "extend" should read --extends--.
Column 6, line 20, "(a) substrate;" should read -- (a) a substrate; --.

Signed and Sealed this

Tenth Day of May, 1988

Attest:

DONALD J. QUIGG

Attesting Officer    Commissioner of Patents and Trademarks